(12) United States Patent
Freimuth (10) Patent No.: US 12,094,736 B2
(45) Date of Patent: Sep. 17, 2024

(54) APPARATUS AND METHOD FOR TRANSFERRING ELECTRONIC COMPONENTS FROM A FIRST CARRIER TO A SECOND CARRIER

(71) Applicant: Muehlbauer GmbH & Co. KG, Roding (DE)

(72) Inventor: Marcel Freimuth, Drachselried (DE)

(73) Assignee: MUEHLBAUER GMBH & CO. KG, Roding (DE)

( * ) Notice: Subject to any disclaimer, the term of this patent is extended or adjusted under 35 U.S.C. 154(b) by 159 days.

(21) Appl. No.: 17/904,418

(22) PCT Filed: Feb. 19, 2021

(86) PCT No.: PCT/EP2021/054115
§ 371 (c)(1),
(2) Date: Aug. 17, 2022

(87) PCT Pub. No.: WO2021/165450
PCT Pub. Date: Aug. 26, 2021

(65) Prior Publication Data
US 2023/0056420 A1    Feb. 23, 2023

(30) Foreign Application Priority Data

Feb. 21, 2020   (DE) ..................... 10 2020 001 439.9

(51) Int. Cl.
*B23K 37/04* (2006.01)
*H01L 21/67* (2006.01)
*B23K 101/40* (2006.01)

(52) U.S. Cl.
CPC ........ *H01L 21/67132* (2013.01); *B23K 37/04* (2013.01); *B23K 2101/40* (2018.08)

(58) Field of Classification Search
CPC ......... H01L 21/67132; H01L 21/67144; H01L 21/6838; B23K 37/04–0408; B23K 2101/36–42; B23K 1/0016; B31D 1/028
(Continued)

(56) References Cited

U.S. PATENT DOCUMENTS

| 4,667,402 A | 5/1987 | Wilde |
| 6,201,306 B1 | 3/2001 | Kurosawa et al. |

(Continued)

FOREIGN PATENT DOCUMENTS

| CN | 108292615 A * | 7/2018 | ........... B65G 47/915 |
| DE | 19822512 A1 | 10/1999 | |

(Continued)

*Primary Examiner* — Kiley S Stoner
(74) *Attorney, Agent, or Firm* — John A. Miller; Shumaker, Loop & Kendrick, LLP (57) ABSTRACT

A device configured to receive a first carrier with a first receptacle; to guide a second carrier in a conveying direction with a second receptacle; to receive the first carrier with the first receptacle so that the components carried by it are oriented towards the second receptacle; to separate the components in response to information from a control unit; and convey the second carrier in its position relative to a placement position so that an electronic subassembly on the second carrier reaches the placement position. The second receptacle has a contact surface for the second carrier which is curved in the conveying direction of the second carrier and the second receptacle at least partially includes a second conveying device which occupies only part of the second receptacle transversely to the conveying direction of the second carrier.

16 Claims, 4 Drawing Sheets

(58) Field of Classification Search
USPC ........ 228/179.1–180.22, 6.1–6.2, 44.7, 49.1, 228/49.5
See application file for complete search history.

(56) References Cited

U.S. PATENT DOCUMENTS

| | | | |
|---|---|---|---|
| 6,204,092 B1* | 3/2001 | Freund | H01L 21/67132 438/464 |
| 6,297,075 B1* | 10/2001 | Odajima | H01L 21/6836 438/464 |
| 9,629,255 B2* | 4/2017 | Maijala | H05K 13/0465 |
| 2002/0190741 A1 | 12/2002 | Maruyama et al. | |
| 2004/0154161 A1* | 8/2004 | Aoyama | B65G 29/00 29/709 |
| 2006/0013680 A1 | 1/2006 | Haba et al. | |
| 2008/0005895 A1* | 1/2008 | Aoyama | G06K 19/07749 901/32 |
| 2008/0086874 A1 | 4/2008 | Cheung et al. | |
| 2016/0308269 A1 | 10/2016 | Marinov | |
| 2018/0144971 A1* | 5/2018 | Peterson | H01L 21/67766 |
| 2020/0105551 A1* | 4/2020 | Wendt | H01L 21/677 |
| 2020/0105570 A1* | 4/2020 | Peterson | H01L 21/67766 |
| 2020/0335374 A1* | 10/2020 | Liao | H01L 21/67132 |
| 2021/0193497 A1* | 6/2021 | You | H01L 21/67144 |
| 2022/0029045 A1* | 1/2022 | Li | H01L 21/67144 |
| 2022/0108901 A1* | 4/2022 | Au | H01L 21/67132 |

FOREIGN PATENT DOCUMENTS

| | | | |
|---|---|---|---|
| DE | 10349847 B3 | 5/2005 | |
| DE | 102009020540 A1 * | 12/2010 | ........... G06K 19/077 |
| DE | 102011104225 B4 | 6/2011 | |
| DE | 102011017218 A1 | 10/2012 | |
| DE | 102018006760 A1 * | 2/2020 | ....... H01L 21/67132 |
| DE | 102018006771 A1 * | 2/2020 | ............ B65G 47/90 |
| DE | 102020001439 B3 * | 6/2021 | ............ B23K 37/04 |
| EP | 0565781 B1 | 11/1995 | |
| EP | 949662 A2 | 10/1999 | |
| EP | 1764826 A1 | 3/2007 | |
| EP | 2491583 B1 | 8/2012 | |
| JP | S53100765 A | 9/1978 | |
| JP | S55070041 A | 5/1980 | |
| JP | S60097634 A | 5/1985 | |
| JP | H01109737 A | 4/1989 | |
| JP | H09162204 A | 6/1997 | |
| JP | 2002050670 A | 2/2002 | |
| JP | 2003109979 A | 4/2003 | |
| JP | 2008004936 A | 1/2008 | |
| JP | 2009238881 A | 10/2009 | |
| JP | 2010161155 A | 7/2010 | |
| JP | 5267451 A | 8/2013 | |
| WO | 0014789 A1 | 3/2000 | |
| WO | 2007137888 A1 | 12/2007 | |
| WO | 2017076989 A1 | 5/2017 | |
| WO | WO-2018015801 A1 * | 1/2018 | ........... B65H 29/242 |
| WO | WO-2018028994 A1 * | 2/2018 | ....... H01L 21/67144 |

* cited by examiner

APPARATUS AND METHOD FOR TRANSFERRING ELECTRONIC COMPONENTS FROM A FIRST CARRIER TO A SECOND CARRIER

CROSS REFERENCE TO RELATED APPLICATIONS

This application is a National Stage application of International Application No. PCT/EP2021/054115 filed on Feb. 19, 2021, which claims priority to German Application No. 10 2020 001 439.9 filed Feb. 21, 2020.

BACKGROUND

Field

An apparatus and method for transferring electronic components from a first carrier to a second carrier are described herein. An apparatus and method for applying adhesive to the second carrier are also described. In particular, a device and method for separating an electronic component from the first carrier and transferring it directly to the second carrier are described. The second carrier can, for example, carry one or more electronic subassemblies, to each of which an electronic component is to be transferred.

Discussion

When transferring electronic components, especially chips (dies), and especially when transferring individual electronic components, there is generally the problem that they can be easily damaged and must therefore be handled with great care. In addition, electronic components are subject to continuous miniaturization, so that the requirements for accuracy in the transfer of electronic components are continuously increasing.

WO 2017/076989 A1 relates to a processing system and method for processing a flexible substrate, for example a web using a tensioner with a vacuum plate movable along a transport direction of the flexible substrate with an indexer that intermittently moves the flexible substrate for processing. The vacuum plate is configured to be moved along the transport direction. An indexer is configured to intermittently move the flexible substrate for processing. A control unit is configured to control the tensioner and the indexer such that a relative speed between the indexer and the vacuum plate of the tensioner is maintained above a predetermined threshold under all working conditions, even when the flexible substrate is stopped. The web that may be used in the processing system has a number of electrical structures separated by a distance from each other. These electrical structures can be any type of flexible electronics.

DE 10 2011 104 225 B4 relates to a device for positioning electronic components to be transferred relative to an ejector, with the ejector comprising a slider for at least one electronic component and a housing surrounding the slider, the housing having a first light-transmitting region. A first carrier provides the electronic components to be transferred. The first carrier has a first side facing the ejector and a second side facing away from the ejector. A plurality of the electronic components are provided on the second side. An image data acquisition device is adapted to acquire, through the first translucent region of the housing, image data of a region in which the slider is adapted to interact with the at least one electronic component. A control unit is set up to determine position data of the electronic component to be supported from the captured image data and to generate control errors on the basis of the position data. At least one actuator is arranged to move the first carrier and the ejector relative to one another on the basis of the control commands in order to change a relationship between a longitudinal axis of the slider and a central axis of the electronic component to be transmitted, wherein the ejector comprises a first mirror arranged inside the housing.

DE 103 49 847 B3 describes a positioning device and a positioning method for the transfer of electronic components. A semiconductor wafer arranged on a carrier foil is arranged above and parallel to a tape-like substrate. The wafer can be moved within the wafer plane by means of a wafer holder and additionally rotated about a rotation axis perpendicular to the wafer plane. An ejector comprises an ejector needle which acts by means of a downward movement on the back of a chip to be detached and detaches it from the carrier film. The chip detached from the carrier film is then deposited in a bond position on the ribbon-like substrate.

JP 2003 109979 A concerns a device with at least two sliders for separating components from a first carrier. The components are each picked up by a suction pipette of a transfer element. In a final step, the transfer element together with suction pipettes and components is positioned over a second carrier, which has already been prepared with adhesive, and the components are deposited on the second carrier. The components are not transferred directly from the first carrier to the second carrier, but are picked up after separation from the first carrier by means of a transfer element, and in a subsequent step are precisely oriented by the transfer element and attached to the second carrier.

DE 10 2018 006 771 A1 relates to a solution for increasing the throughput when transferring components from the first to the second carrier with a high degree of accuracy and repeatability, whereby second carriers that are not very transparent or not transparent at all can also be used without any loss of quality in the positional accuracy of the component placement. A device for transferring electronic components from a first carrier to a second carrier is used for this purpose, the first carrier detachably carrying a plurality of individual components therefrom, and the second carrier being of quasi-endless design and carrying a plurality of electronic subassemblies in its longitudinal and transverse er extension to each of which one of the components is to be transferred from the first carrier. The device comprises a first receptacle adapted to receive the first carrier; a second receptacle directed to guide the second carrier along its longitudinal extension in a direction of the of the second carrier; the first receptacle being directed to receive the first carrier such that the components carried thereby are oriented toward the second receptacle; a separating device arranged to separate the components from the first carrier in a contacting or non-contacting manner in order to transfer them to the second carrier; a first conveying device provided and arranged to move the first receptacle transversely to the conveying direction of the second carrier relative to the second receptacle; a second conveying device provided and arranged to move the separating device transversely to the conveying direction of the second carrier relative to the second receptacle; a first inspection means provided and arranged to detect at least one of the components in its position relative to a placement position on the second receptacle guiding the second carrier; a second inspection device, which is arranged upstream of the placement position and is provided and directed to detect at least one of the plurality of electronic subassemblies on the second carrier in its position relative to the second receptacle and to signal information representing the position to a control unit; a third conveyor which is provided and arranged, in response to information signaled by the control unit, to convey the second carrier in its position relative to the placement position in such a way that the at least one of the plurality of electronic subassemblies on the second carrier reaches the placement position on the second receptacle guiding the second carrier.

Further devices and methods for transferring electronic components, which form the technological background to the device and method described herein, are described in JP 5267451 A, EP 0 565 781 B1 and DE 198 22 512 A1, U.S. Pat. No. 4,667,402 B1, US 2008/0086874 A1, EP 1 764 826 A1, US 2002/019074 A1, US 2009/242124 A1, EP 0 140 126 A1, U.S. Pat. No. 4,990,051 B1, US 2006/237142 A1, US 2007/293022 A1, U.S. Pat. No. 6,201,306 B1, JP 2009 238881 A, JP 2010 161155 A, JP 60 097634 A, JP 01 109737 A, JP 55 070041 A, JP 2002 050670 A, JP 09 162204 A, JP 53 100765 A, JP 2008 004936 A, WO 2007/137888 A1, WO 2000/014789 A1, EP 949 662 A2, US 2006/013680 A1, US 2016/308269 A1, DE 10 2011 017 218 A1, EP 2 491 583 B1 described.

In view of this, an apparatus and a method are desired with which the throughput during transfer of the components from the first to the second carrier can be increased with a high degree of accuracy and repeatability. In addition, it should also be possible to use second carriers with little or no transparency without any loss of quality in the positional accuracy of the component deposit. Finally, the components should be handled gently.

SUMMARY

To solve this problem, an apparatus for transferring electronic components from a first carrier to a second carrier is proposed, which is used to transfer electronic components, for example RFID chips, from a first carrier, for example a wafer carrier film, to a second carrier, for example a quasi-endless (antenna) carrier tape material, which carries a large number of electronic subassemblies, for example antennas, in its transverse and/or longitudinal extension. Thereby, in a variant, the first carrier carries a plurality of individual components, for example RFID chips, detachably from it. One of the components (RFID chips) is transferred from the first carrier (wafer carrier film) to the second carrier, the (antenna) carrier tape material.

The apparatus is designed to pick up the first carrier with a first receptacle; guide the second carrier along its longitudinal extension in a conveying direction of the second carrier with a second receptacle; pick up the first carrier with the first receptacle in such a way that the components carried by it are oriented towards the second receptacle; separate the components from the first carrier with a separating device in a contacting or non-contacting manner in response to information signaled by a control unit in order to transfer them to the second carrier; convey the second carrier, in response to information signaled by the control unit, in its position relative to the deposition position with a conveying device in such a way that an electronic subassembly on the second carrier reaches the deposition position on the second receptacle guiding the second carrier; the second receptacle having a contact for the second carrier which is curved in the conveying direction of the second carrier.

In one variant, a drive is assigned to the second holder as a conveying device, which only takes up part of the second holder transversely to the conveying direction of the second carrier. The conveying device can be provided and set up to convey the second carrier in its position relative to the storage position in response to information signaled by a control unit in such a way that an electronic subassembly on the second carrier reaches the storage position on the second receptacle guiding the second carrier. In the area of the second receptacle, a heating is provided and arranged to act on the second carrier in order to temper the before, at, and/or after the placement position from its side lying away from the first receptacle.

In particular, the apparatus is used to transfer electronic components from a first carrier to a second carrier. The first carrier carries a plurality of individual-components detachably therefrom. The second carrier is quasi-endless and carries in its longitudinal extension a plurality of electronic subassemblies to each of which one of the components is to be transferred from the first carrier. The apparatus comprises a first receptacle provided and adapted to receive the first carrier. The apparatus comprises a second receptacle provided and adapted to guide the second carrier along its longitudinal extent in a conveying direction of the second carrier. In this case, the first receptacle is provided and arranged to receive the first carrier in such a way that the components carried by it are oriented towards the second receptacle.

A separating device is provided and set up to separate the components from the first carrier in contact or without contact in order to transfer them to the second carrier. A first conveying device is provided and set up to move the first receptacle me relative to the second receptacle.

A conveying device is provided and set up for this purpose in response to information signaled by a control unit to convey the second carrier in its position relative to the placement position in such a way that an electronic subassembly on the second carrier reaches the placement position on the second receptacle guiding the second carrier. The second receptacle has a contact surface for the second carrier that is curved in the conveying direction of the second carrier.

A heating acting in the area of the second receptacle is provided and set up to temper the second carrier before, at and/or after the storage position from its side facing away from the first receptacle.

The second receptacle comprises a conveyor at least partially occupying only a portion of the second receptacle transversely to the conveying direction of the second carrier.

In a further variant, the second support is designed as a circular-cylindrical drum and can be heated as a whole with a heating. In one variant, this heatable drum can be rotated by a conveyor device comprising a drive, which transports the second carrier in the conveying direction towards/away from the placement position of the component.

Instead of a circular cylindrical drum, the second receptacle can also be designed as a surface that is convexly curved or curved towards the first receptacle, which is arranged in a stationary manner and to which the further, third conveyor device for the second carrier is spatially and/or functionally assigned.

Up to now, single-row tape material has generally been used as a second carrier for the assembly of subassemblies or connection frames by means of direct ab lage (DDA=direct die attach), on which the components from the first carrier are placed. The presented solution allows single-row tape material to be used as a second carrier. The presented solution allows single-row strip material to be used as the second carrier. This transfers the reduced complexity and higher throughput of the direct deposit arrangement to the range of systems capable of using single-row web material. The solution proposed here also allows to replace the previous inspection of the second carrier at the placement position. This means that even two carriers with little or no transparency can be used without any loss of accuracy during component placement in order to bring a component together with the subassembly with a precise fit.

Conventional DDA systems for single-row web material use a camera mounted directly in the deposition area on the back/bottom side of the web material of the second carrier to detect the deposition position on the web material before component deposition. Due to this arrangement, conventional DDA systems can only process fully transparent materials, e.g. PET, without limiting the depositing accuracy; non-transparent materials as second carriers are generally not possible.

The proposed solution detects the placement position on the web material (spatially/temporally) before the actual component deposit, whereby the second image acquisition device directly, i.e. not through the second carrier, but detects the respective component placement position on the second carrier itself. Then the second carrier is conveyed to the placement position position in such a controlled manner that the component placement position is aligned as precisely as possible with the position of the component to be deposited on the first carrier when the separating device separates this component from the first carrier and this is then transferred in the Z direction to the second carrier.

Compared to pick-and-place systems or flip-chip systems, the proposed solution achieves a significantly higher throughput of components due to its structurally lower complexity. The components can be separated directly one by one from the (cut) wafer and placed in the respective subassembly group (or connection frame or the like) on the second carrier; an intermediate carrier as with conventional automatic placement machines is no longer required. The transparency of the material of the second carrier no longer has any influence on the positional accuracy when placing the component.

For example, the apparatus presented here allows RFID inlays or RFID modules to be manufactured in which the electrical contact between the RFID chip and the antenna is established by soldering. For this purpose, the antenna is comprised of an electrically conductive material that melts under the influence of the appropriate temperature. In this molten state, the RFID chip is placed with its contacts (bumps) in the exposed ends of the antenna. In this way, the contacts of the RFID chip are permanently and sufficiently electrically and mechanically connected to the contact points of the antenna.

Thus, the electrical and mechanical connection must already be established when the component is deposited on the carrier material (tape), or more precisely, on the antennas which are applied to the carrier material (tape). For this purpose, the carrier material (tape) is brought to a temperature at the time of deposition at which the solder/material of the antenna is brought to its melting temperature at least in the area of the exposed ends of the antenna, and the contacts of the RFID chip are brought into contact with it.

This approach allows the conductive adhesive (ACA) used in conventional RFID inlay manufacturing between the exposed ends of the antenna and the contacts of the RFID chip to be eliminated.

If an adhesive is used to connect the RFID chip to the antenna, it only has to ensure the mechanical connection. Inexpensive adhesives or hot-melt adhesives that are not filled with electrical conductor material are sufficient for this purpose. In one variant, this non-conductive adhesive can already be applied to the carrier material (tape) at least in the area of the exposed ends of the antenna. When the carrier material (tape) is tempered, the solder/material of the antenna and the non-conductive adhesive are brought to their melting temperature, which means that in one variant a dispensing device for adhesive can also be omitted.

Furthermore, with some variants an otherwise usual final bond module of the process chain can be omitted. This significantly reduces the complexity, size and cost of the machine.

With the presented apparatus and method, the carrier material (tape), on which e.g. antennas are applied, is heated on its way to the deposition position, at the deposition position, and/or on its way from the deposition position by at least one corresponding heating element. This/these heating element(s) act(s) on the side remote from the subassembly (e.g. antenna) on the carrier material (tape), so that at least the solder/material of the exposed ends of the antenna is brought to its melting temperature. By releasing the component from the first carrier, the contacts of the RFID chip are brought into contact with the exposed ends of the antenna. After (controlled) cooling of the solder/material of the exposed ends of the antenna below the melting temperature, the component (the RFID chip) is electrically and mechanically connected to the part assembly (antenna).

In one variant of the apparatus, the curved contact surface and/or the conveyor device has openings to be connected to a vacuum source. These are provided and arranged to bring the second carrier into close contact with the curved contact surface. During transport of the second carrier, the openings, such as vacuum holes, which are pressurized with underpressure, provide slip-free fixation of the second carrier, which enables controlled transport and precise placement of the component relative to the subassembly group.

In one embodiment of the apparatus, the curved contact surface is rigid. Furthermore, the conveying device divides the curved contact surface along the conveying direction of the second carrier into at least two sections.

In a further variant of the device, a heat shield is arranged upstream and/or downstream of the placement position, as viewed in the conveying direction of the second carrier. Alternatively or cumulatively, a gap for the second carrier is arranged between the curved contact surface and the heat shield. This ensures that the heating device does not heat up the first carrier and an adhesive layer located between the components and the first carrier, or heats it up as little as possible.

In a further variant, a buffer store is assigned to the device on the upstream and/or downstream side of the placement position or the curved contact surface, which is designed and set up to hold a supply of the second carrier. In one variant, this buffer store is designed as a box open towards the placement position, which holds the two apparatus carriers, if necessary with negative pressure, or guides them with a delay.

In a further variant, a first image acquisition device is provided and set up to perform an image capture of at least one component located on the first carrier in the area of the placement position and to signal this to the control unit. In a further variant, a second and/or a third image acquisition device is arranged, which is provided and set up to perform image captures of at least one electronic subassembly on the second carrier without/with the component in the region upstream and/or downstream of the placement position and to signal this to the control unit.

In a further variant, a distance is provided between the curved contact surface with the conveyor and the first receptacle, which can be adjusted by means of a first adjusting device.

In a further variant, the curved contact surface with the conveying device is held by a substantially U-shaped receptacle, which is accommodated by two bearings and is movably guided substantially perpendicular to the conveying direction of the second carrier. If necessary, the U-shaped receptacle, the curved contact surface and/or the at least one conveying device are to be positioned by a respective control device in response to information signaled by the control unit.

In a further variant, at least one hold-down device is provided in the area on the upstream and/or downstream side of the curved contact surface or the depositing position and is set up to subject the second carrier in the area of the curved contact surface to the under pressure.

In a further variant, at least one heating zone is arranged in the area on the upstream and/or downstream side and/or along the transverse extension of the curved contact surface or the placement position, which heating zone is provided and set up to emit heat in response to information signaled by the control unit, whereby in the case of several heating zones, these are provided and set up to emit heat independently of one another in response to information signaled by the control unit.

In a further variant, a curved contact surface and an adhesive dispenser are arranged in the area upstream of the placement position, which are provided and set up to pass the second carrier between them and to dispense portioned adhesive onto the second carrier in response to information signaled by the control unit.

In a further variant, a fourth and/or a fifth image acquisition device is arranged in the region on the upstream and/or downstream side of the further curved contact surface, which is provided and set up to carry out image captures of at least one electronic part assembly on the second carrier in the region on the upstream and/or downstream side of the further curved contact surface without/with the dispensed adhesive and to signal this to the control unit.

In a further variant, the further curved contact surface is assigned an additional conveyor, which is provided and set up to convey the second carrier along the further curved contact surface.

In a further variant, an adjustment device is associated with the separating device and is provided and arranged to position the separating device in the conveying direction of the second carrier and/or transversely thereto. In a further variant, a first image acquisition device is arranged at the placement position and is provided and set up to capture at least one of the subassemblies in its position relative to a placement position on the second holder guiding the second carrier. If necessary, a second image detection device is arranged, and is provided and set up to be arranged upstream of the placement position (AP) and is provided and set up to detect at least one of the electronic subassemblies on the second carrier in its position relative to the second receptacle and to signal information representing the detected position to a control unit.

The conveyor device functionally/spatially associated with the second tray is also referred to here as the third or further conveyor device for the second carrier.

A method presented herein is for transferring electronic components from a first carrier to a second carrier, wherein the first carrier detachably carries a plurality of individual components, and the second carrier is quasi-endless and carries in its longitudinal extension a plurality of electronic subassemblies, to each of which one of the components is to be transferred from the first carrier. The method comprises the following steps in the order indicated below or in a different order:

receiving the first carrier with a first receptacle;

guiding the second carrier along its longitudinal extension in a conveying direction of the second carrier with a second receptacle;

receiving the first carrier with the first receptacle such that the components carried thereby are oriented toward the second receptacle;

separating the components from the first carrier with a separating device in a contacting or non-contacting manner to transfer them to the second carrier;

conveying the second carrier in its position relative to the placement position in response to information signaled by a control unit by means of a conveying device such that an electronic subassembly on the second carrier reaches the placement position on the second receptacle guiding the second carrier; and acting on the second carrier in the region of the second receptacles by means of a heating such that the second carrier is tempered before, at and/or after the placement position from its side remote from the first receptacle.

This temperature control is carried out—by means of appropriate control of the heating by the control unit—uniformly or in sections/zones in the area of the second receptacle depending on the material properties/melting point of contact points of the component to be transferred and/or the material properties/melting point of contact points of the components/electronic subassembly on the second carrier. In this way, a mechanically and electrically secure connection between the component to be transferred and the component/the electronic subassembly on the second carrier can be ensured quickly and simply.

One or more of the image acquisition device s is used to determine the position of the second carrier and the subassembly located thereon for the placement of the component to be placed thereon before, at, and/or after the placement position. The result of this image capture(s) is then used by the control unit, in combination with position data of the further conveyor, to determine the exact position of the subassembly on the second carrier in the placement position and to position the first carrier with the component to be deposited accordingly. One of the image capture devices inspects the top of the second carrier. This means that the quality of the image capture is independent of the transparency of the carrier material.

A preferably fixed heating in the form of a heating strip with one or more heating zones to be heated to different temperatures, which at least partially follows the contour of the second holder, heats the second carrier in the area of the second holder. Thus the second carrier is tempered before, at and/or after the placement position from its side remote from the first receptacle. The possibly several heating zones of the heating strip allow the heating and cooling behavior of the material to be set more precisely. For this purpose, in one variant the heating is located in a recess of the second receptacle. Here, in one variation ante, the heating strip or a part thereof can project slightly beyond the second receptacle in the direction towards the first receptacle. In this way, the second support and the part(s) located on it can be temperature-controlled in a targeted and spatially/locally defined manner.

In one embodiment, for example, two, three or more subassemblies are arranged on the second carrier in the transverse direction. Accordingly, two, three or more heatings spaced in the transverse direction are provided as annular carrier disks with respective heating strips.

Alternatively or cumulatively to the mainly contact-tempering heating with the heating strip, a contactless heating of the second carrier and the subassembly(s) located thereon by laser, infrared or induction is possible.

In one variant, the first holder with the first carrier is located directly above the second carrier on the second holder. In contrast to previous solutions, the first fixture and the separator have a movement space transverse to the conveying direction of the second carrier that approximately corresponds to the width of the second carrier. As a result, the working/component deposit area is significantly increased over the width of the second carrier. As a result, several adjacent rows of electro nical subassemblies, for example RFID antennas, can be reached on a wide second carrier with the first carrier and be placed at the placement position by actuating the separator.

In one variant, the first carrier has a first side facing the separating device and a second side facing away from the separating device and facing the second carrier on/at the second receptacle, the second side of the first carrier having the plurality of components detachably applied thereto; the first image acquisition device is arranged to capture image data of a region in which the separating means is arranged for contacting or non-contacting with at least one of the components in order to separate it from the first carrier; and the control means is arranged to determine position data of the component to be transferred from the captured image data, and to generate control commands for the separating means and the respective conveyors of the means on the basis of the position data.

In one variant, the second image acquisition device is arranged on the upstream side—with respect to the conveying direction of the second carrier—to the placement position at the second carrier and is provided and set up to capture, in the conveying direction of the second carrier and/or transversely to the conveying direction of the second carrier, in each case one or more of the plurality of electronic subassemblies on the second carrier in their position relative to the second receptacle and to signal information representing the captured position to the control unit.

In one variant, a first sensor device is assigned to the third conveyor device, which is provided for this purpose and is set up to signal to the control unit information on the conveying direction, the conveying of the second carrier and/or the positions of the electronic subassemblies located on it relative to the storage position.

In one variant, the control unit is provided and set up, based on the information from the second image acquisition device on the position of the at least one electronic subassembly and the information on the conveying direction and conveying path of the second carrier, and based on the information from the first image acquisition device on the position of at least one of the components relative to the depositing position, to activate the second conveying a direction, to move the separating device transversely to the conveying direction of the second carrier to the depositing position, and to activate the separating device in the sense of separating the component from the first carrier.

In one embodiment, the apparatus comprises a fourth conveyor adapted and arranged, in response to information signaled by the control unit, to move the first receptacle along the conveying direction of the second carrier relative to the second receptacle; and/or a fifth conveyor adapted and arranged, in response to information signaled by the control unit, to rotate the first receptacle through an angle relative to the second receptacle.

In another embodiment, the apparatus comprises a sixth conveying means provided and arranged for conveying the second carrier along the conveying direction over the second receptacle in response to information signaled by the control means (slip free and stretch-free) such that the at least one of the plurality of electronic subassemblies on the second carrier reaches the placement position on the second receptacle guiding the second carrier.

In a further variant of the device, the separating device, if it is designed to separate the components from the first carrier by contact, comprises an impact needle which is set up and dimensioned to point at the first carrier in response to Information signaled by the control unit, in order to detach one of the components from the first carrier and transfer it to the second carrier; or if it is designed to separate the components from the first carrier without contact, the separating device comprises a control an energy source which is designed and dimensioned to supply the first carrier with energy in response to information signaled by the control in order to detach one of the components from the first carrier and transfer it to the second carrier.

In a further variant of the device, the second receptacle comprises a (circular) cylindrical drum or a convexly curved surface via which the second carrier reaches the position on the second receptacle, wherein, in one variant, the second receptacle has outlets on its jacket/surface guiding the second carrier which are directed to hold the two ted carrier on the second receptacle (slip-free and stretch-free) with tels underpressure.

In a further variant, the device comprises a third image capture device, which—with respect to the conveying direction of the second carrier—is arranged on the downstream side with respect to the placement position and is provided and set up to capture at least one of the plurality of elec tro ni tical subassemblies on the second carrier and the component transferred to it in its position relative to one other and to signal an information representing the captured position to the control unit.

In a further variant, the device comprises an eighth conveying device which is provided and set up to convey the second image acquisition device relative to the second receptacle and the placement position in order to capture at least one component placement position on the second carrier by means of the second image acquisition device and/or in order to detect the position of at least one of the plurality of electronic subassemblies on the second carrier and to signal the detected position to the control unit; and/or a ninth conveying means provided and arranged to convey said third image acquisition device relative to said second support and said storage position to detect at least one of said plurality of electronic subassemblies on said second support and said component transferred thereto in position relative to each other and to signal them information representing said detected position to said control.

Alternatively, the second and/or third image capture devices are pivotally mounted to the second mount and are electronically controlled or manually adjustable in their orientation to the component deposit location or the electronic subassemblies on the second carrier and the component transferred thereto.

To solve this task, a further device for applying adhesive from a supply to a second carrier is also proposed, wherein the second carrier is designed to be qua endless and supports in its longitudinal and transverse extension a plurality of electrical subassemblies to which the adhesive is to be applied in order to subsequently carry a component to one of the subassemblies, and wherein the further device comprises: a third receptacle adapted to have the second carrier guided thereover along its longitudinal extension in a conveying direction of the second carrier; a dispensing device for adhesive adapted to dispense adhesive in a controlled and metered manner toward the third receptacle to an adhesive location on the second carrier at an adhesive dispensing bring position at which one of the plurality of electronic part construction groups is located; an eleventh conveying means provided and adapted to move said adhesive dispensing means transversely to the direction of conveyance of said second carrier relative to said third receptacle; a fourth image acquisition device arranged upstream of the adhesive dispensing position and provided and arranged to capture at least one of the plurality of electronic subassemblies on the second carrier in its position relative to the third receptacle and to signal information representing the captured position to the control unit; a twelfth conveying means provided and arranged to convey, in response to information signaled by the control unit, the second carrier in its position relative to the adhesive dispensing position such that the at least one of the plurality of electronic subassemblies with the adhesive location on the second carrier reaches the adhesive dispensing position on the third receptacle guiding the second carrier.

The adhesive dispensing device is advantageously to be used in cooperation with and on the device for transferring electronic components from a first carrier to a second carrier, but also independently thereof.

The adhesive dispensing device also allows multi-row web material to be used as a second carrier, with the reduced complexity and higher throughput of adhesive dispensing being transferred to the area of equipment that is capable of processing multi-row web material. The adhesive dispensing solution proposed here also allows to replace the previous inspection of the second carrier at the adhesive dispensing position. This means that even two non-transparent substrates can be processed without any loss of accuracy during adhesive application prior to part placement.

Conventional DDA systems for single-row web material use a camera mounted directly in the deposition area on the back/)bottom side of the web material of the second carrier to detect the adhesive deposition position on the web material prior to adhesive deposition. Due to this arrangement, conventional DDA equipment can only-process fully transparent materials, e.g. PET, without limiting the deposition accuracy; in transparent materials as the second carrier are generally not possible.

The proposed solution detects the glue location on the web material (spatially/temporally) before the actual glue application, whereby the fourth image acquisition device detects directly, i.e. not through the second carrier, but the respective glue location—in connection with the respective electronic subassembly—on the second carrier itself. Then the second carrier is conveyed to the adhesive dispensing position in such a controlled manner that the adhesive location is aligned as precisely as possible with the position of the outlet of the dispensing device for adhesive when the dispensing applies an adhesive (dispenses a portion) to the adhesive location.

In one variant, the fourth image capture device, which—with respect to the conveying direction of the second carrier—is arranged upstream of the adhesive application position at the second carrier and is provided and set up to capture, transversely to the conveying direction of the second carrier, in each case one or more of the plurality of electronic part construction groups on the second carrier in their position relative to the third receptacle and to signal information representing the captured position to the control unit.

In one embodiment, the twelfth conveyor has a second sensor device associated with it, which is provided and set up to provide the control unit with information on the conveying direction and conveying path of the second carrier relative to the adhesive application position.

In one variant, the control unit is provided and set up, based on the information from the fourth image acquisition device on the position of the at least one electronic subassembly and the information on the conveying direction and conveying path of the second carrier, and based on the information from the fourth image acquisition device on the position of at least one of the components relative to the adhesive dispensing position, to activate the eleventh conveying device to move the dispensing device transversely to the conveying direction of the second carrier to the dispensing position and to activate the dispensing device to separate the component from the first carrier, to move the dispensing means transversely to the conveying direction of the second carrier to the dispensing position, and to activate the dispensing means in the sense of separating the component from the first carrier.

In one variant, the apparatus comprises a thirteenth conveying device which is provided and arranged, in response to information signaled by the control unit, to-convey the second carrier along the conveying direction over the second receptacles in such a way (slip-free and stretch-free) that at least one of the plurality of electronic subassemblies on the second carrier reaches the adhesive dispensing position on the second receptacle guiding the second carrier.

In a further variant of the apparatus, the third receptacle comprises a (circular) cylindrical drum or a convexly curved surface via which the second carrier-reaches the application position on the third receptacle, wherein in one variant the second receptacle has outlets on its jacket/surface guiding the second carrier, which outlets are directed to hold the second carrier by means of negative pressure on the third receptacle (slip-free and stretch-free).

In a further variant, the apparatus comprises a fifth image capture device, which—with respect to the conveying direction of the second carrier—is arranged downstream of the adhesive dispensing position and is provided and set up for detecting the position of at least one of the plurality of electronic subassemblies on the second carrier and the adhesive dispensed thereon relative to one another and for signaling information representing the detected position to the control unit.

In a further variant, the apparatus comprises a fourteenth conveying means provided and arranged to convey the fourth image acquisition device relative to the third receptacle and the adhesive dispensing position to capture at least one adhesive location on the second carrier by the fifth image acquisition device to detect at least one of the plurality of electronic subassemblies on the second carrier in its position and to signal information representing the detected position to the control unit; and/or fifteenth conveying means provided and arranged to convey said fifth image sensing means relative to said third receptacle and said adhesive dispensing position to sense at least one of said plurality of electronic subassemblies on said second carrier and the adhesive dispensed thereon in position relative to each other and to signal information representing said sensed position to said control unit.

Alternatively, the fourth and/or the fifth image acquisition device are pivotally mounted and their orientation can be electronically controlled or manually adjusted.

In the above-described devices for transferring electronic components from a first carrier to a second carrier and/or for applying adhesive from a supply to a second carrier, the second through fifth image capture devices do may be configured as follows. An illumination a device is associated with an image capture device, the illumination device being arranged to direct light at ter different wavelengths onto a second support arranged to support an object located on the second support to be received by the image capture a device, a sixteenth, seventeenth, eighteenth and/or nineteenth support a device is arranged to, a sixteenth, seventeenth, eighteenth, and/or nineteenth conveyor is adapted to convey the respective image acquisition device with its associated illumination device along the second support, and an eighth, ninth, fourteenth, and/or fifteenth conveyor provided and arranged to convey the respective second, third, fourth, and/or fifth image acquisition device relative to the respective second and/or third support and the component placement position or the adhesive application position along the conveying direction of the second support.

In one variant of the image capture device, the illumination device comprises a white-light source, a red-light source, and/or an (ultra)blue-light source.

In one variant of the illumination device, the red light source and/or the (ultra) blue light source are designed as a ring light source made of that at least partially surrounds a detection area of the image capture device.

In one variant of the image capture device, the white-light source is arranged on a side of an at least partially light-transmitting beam deflector that is remote from the capture area of the image capture a direction.

In one variant of the image capture device, the image acquisition device comprises a focusing optics, which has a fixed adjustable distance from the side facing it of an at least partially light-transmitting beam deviation.

Although some of the aspects described above have been described in relation to the operation of the apparatus, these aspects may also relate to the structure of the apparatus. Likewise, the aspects described above with respect to the apparatus may apply in a corresponding manner to the mode of operation. While the individual aspects of the device and the mode of operation are described in context to explain their interaction, they are also disclosed independently of each other, the other apparatus and other modes of operation.

BRIEF DESCRIPTION OF THE DRAWING

Further objectives, features, advantages and possible applications will be apparent from the description of embodiments for games following with reference to the associated drawings. The dimensions and proportions of the components shown in the figures are not necessarily to scale here at; they may deviate from what is illustrated here in the case of embodiments for men to be implemented.

The process and apparatus variants described here, as well as their function and operating aspects, are merely intended to provide a better understanding of their structure, mode of operation and properties. The figures are partly schematic, with—essential properties and effects partly shown clearly enlarged in order to clarify the—functions, operating principles, designs and features.

DETAILED DESCRIPTION OF THE EMBODIMENTS

In the figures, corresponding or functionally similar components are provided with matching reference signs. The method and the device are now described on the basis of embodiment examples.

Figure 1:
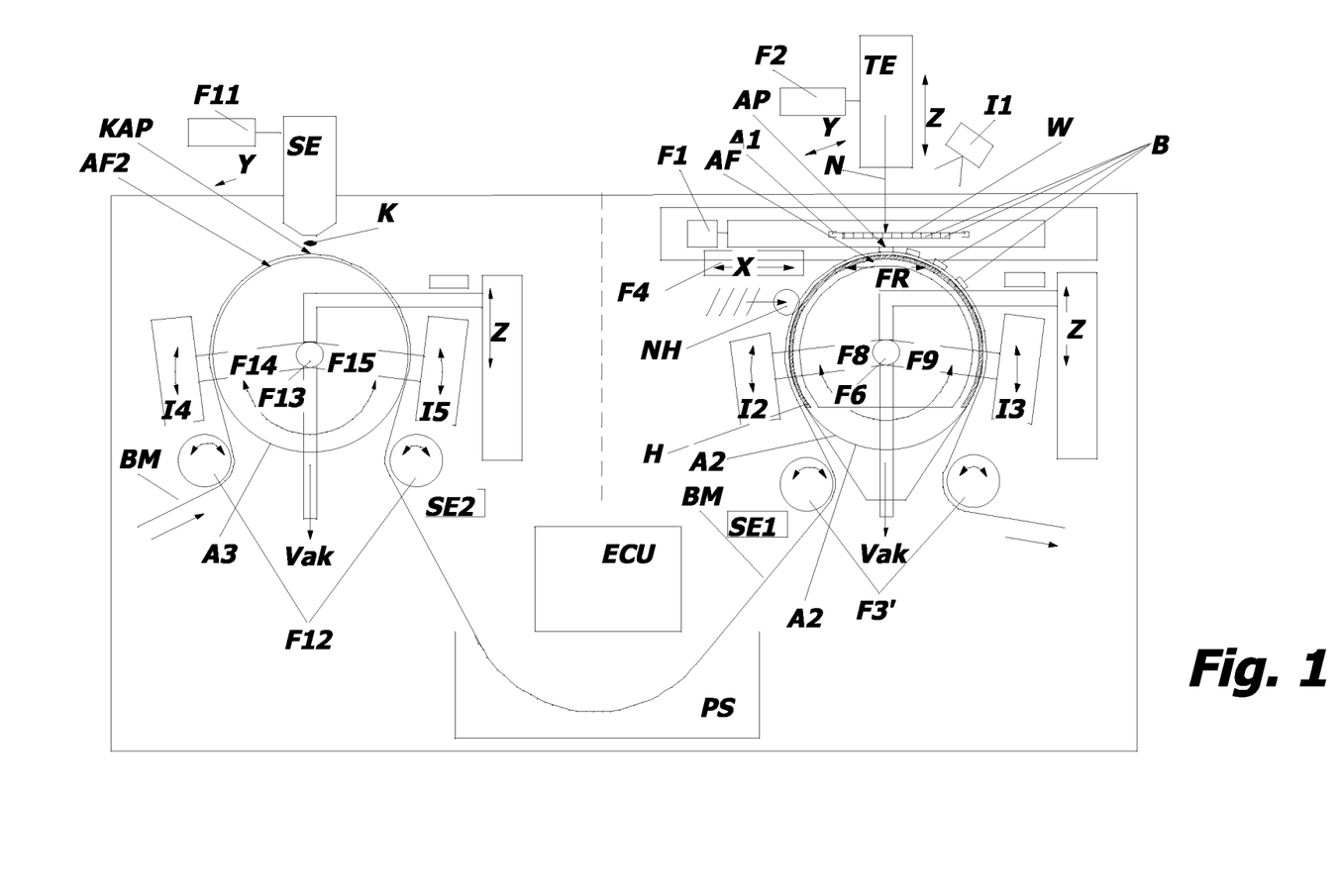
FIG. 1 shows a schematic side plan view of the device for transferring electronic components from a first carrier to a second carrier and a device for applying adhesive to the second carrier.

FIG. 1 shows (on the right side) a device 100 for transferring electronic components B from a first carrier W to a second carrier BM. In this variant, the first carrier W has the shape of an approximately circular semiconductor component wafer and carries a plurality of individual components B which can be detached from it in the manner described below. The second carrier BM is designed as a quasi-endless tape material and carries a plurality of electronic subassemblies ANT in its longitudinal and/or transverse extension. In the variant shown here, the subassemblies ANT are printed or wire-laid antenna sections of an RFID module. To each of the plurality of electronic subassemblies ANT, one of the construction parts B is to be transferred from the first carrier W, respectively. The apparatus has a first receptacle A1 adapted to receive the first carrier W. The first receptacle A1 is adapted in its shape to the first carrier W.

In the variant shown, a second holder A2 has the shape of a circular cylindrical drum. The second carrier BM is guided along its longitudinal extension in a conveying direction FR via the cylinder jacket-shaped outer wall. Details of this are explained further below. The first receptacle A1 receives the first carrier W in such a way that the components B carried by it are oriented toward the second receptacle A2. A separating device TE is provided on the side of the first holder A1 remote from the second holder A2. The first carrier W has a first side facing the separating device TE and a second side facing away from the separating device TE, which faces the second carrier BM on/at the second receptacle A2. The plurality of components B are detachably applied to the second side of the first carrier W. The separating device TE is used to separate the components B from the first carrier W in an agitated or contactless manner in order to transfer them to the second carrier BM at a position AP.

The first fixture A1 is part of a table adjustable in X/Y/theta coordinates, of which the individual X/Y axes and rotational position theta are each to be adjusted by a conveyor device controlled by an electronic control ECU. In particular, a first conveying device F1 in the form of a linear servo drive is provided and is used to move the first receptacle A1 transversely to the conveying direction FR of the second carrier BM relative to the second receptacle A2. (See also FIG. 2).

A second conveying device F2 in the form of a linear servo drive is provided in one embodiment and is directed to move the separating device TE transversely to the conveying direction FR of the second carrier BM relative to the second receptacle A2.

A first image acquisition device 11 in the form of a camera is arranged at the separating device TE and serves to capture in plan view at least one of the components B in its position relative to a placement position AP on the second support A2 guiding the second support BM.

A second image acquisition device 12 is arranged on the upstream side of the placement position AP and is assigned to the second receptacle A2. This second image acquisition device 12 is available in variants with several heatings arranged next to each other (see FIG. 1a), this second image acquisition device 12 can be moved in a controlled manner on the second receptacle A2 (for second carriers BM with a plurality of subassemblies ANT in the transverse direction) in the longitudinal er extension of the drum-shaped second receptacle A2, i.e. transversely to the conveying direction FR of the second carrier BM, and/or can be adjusted manually or by motor by a predetermined win kel amount along the circumference on the circumferential surface of the drum-shaped second receptacle A2. For example, the image acquisition device 12 may be connected to the second receptacle A2 via a pivot arm. In variants for second supports BM with single-row subassemblies ANT, the second image acquisition device 12 is to be rigidly mounted and its field of view is adjusted once.

The second image acquisition device 12 is used to capture the position of at least one of the plurality of electronic subassemblies ANT on the second carrier BM relative to the second receptacle A2 and to signal information representing the captured position to a control unit ECU.

In this embodiment, a third conveying device F3' for the second carrier BM is formed by two transport rollers to be driven in a controlled manner, which are arranged up and down flow sideways to the drum-shaped second receptacle A2, and around which the second carrier BM is guided. In response to information signaled by the control ECU, the second carrier BM is conveyed by the two transport rollers to be driven in a controlled manner in its position relative to the placement position AP in such a way that at least one of the number of electronic subassemblies ANT on the second carrier BM reaches the placement position AP on the second receptacle A2 guiding the second carrier BM.

Alternatively or cumulatively, a further third conveyor device F3" for the second carrier BM is provided and arranged to promote, in response to information signaled on a control unit, the second carrier BM in its position relative to the placement position AP such that an electronic subassembly ANT on the second carrier BM reaches the placement position AP on the second receptacle A2 guiding the second carrier BM.

Figure 1A:
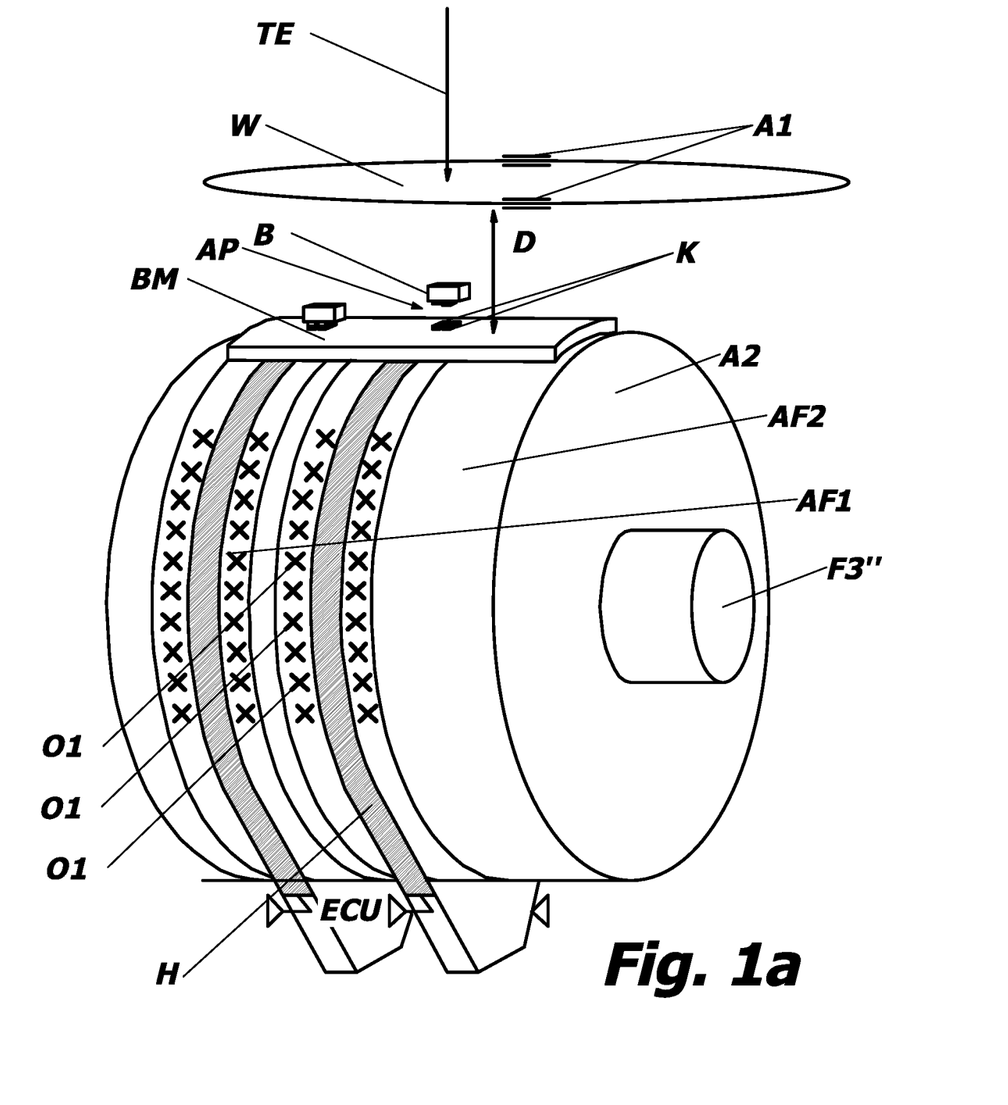
FIG. 1*a* shows a schematic perspective view of a second receptacle with a partially shown second carrier on which a component is to be placed.

This alternative/cumulative embodiment of the further conveying device F3" for the second carrier BM is, if the second receptacle A2 is designed as a circular cylindrical drum, a motorized rotary drive of the drum (see FIG. 1a).

This alternative/cumulative embodiment of the further conveying device F3" is, if the second receptacle A2 is designed as a stationary surface convexly bent or curved towards the first receptacle A1, a drive for the second carrier BM arranged on either side of a respective heating H.

It should be understood that the placement position AP can change both in the longitudinal direction of the second support BM and in its transverse extension, in order to deposit a component B precisely at the position of the subassembly ANT seen before, while a corresponding area of the second support BM is located on the second receptacle A2 and is to be brought into alignment with the component B on the first support W. Accordingly, the first support W is also to be displaced under the control of the control ECU, both in the longitudinal direction of the second support BM and in its transverse extension.

It is evident that a multi-row strip material is used as the second carrier BM. This is understood to mean strip material which, in its transverse extension, carries rows with, for example, two, three or more subassemblies ANT which are repeated quasi-endlessly in the longitudinal direction (for the direction) of the strip material. As a second carrier BM, low to non-transparent carrier material can be used without accuracy losses in component placement.

In the embodiment shown in FIG. 1a, the second receptacle A2 is a rigid, approximately circular-cylindrical drum with several sections along the cylinder axis (see also FIG. 3), the individual sections AF1, AF2 of which are stationary or can be rotated by a drive or by corresponding drive/conveying devices. Here, in one variant, one of the two sections AF1, AF2 of the approximately circular cylindrical drum is stationary, and the other part is rotating. Between two sections AF1, AF2 of the approximately circular-cylindrical drum of the second receptacle A2, a fixed heating H is arranged opposite these two sections AF1, AF2 in the form of an approximately ring shaped carrier disk, on the circumference of which the heating H is arranged. The outer circumference of the annular carrier disk corresponds approximately to the diameter of the circular cylindrical drum of the second receptacle A2 or is slightly larger. The heating H is provided and set up to heat the two carriers BM and in particular the subassemblies ANT located thereon before, at and/or after the placement position AP from the side of the second receptacle A2 remote from the first receptacle A1.

Alternatively, the two sections AF1, AF2 can be rotated on both sides of the stationary heating H. In another variant, a rotating part with the underpressure openings O1 is located on one or both sides between the stationary heating H and the two likewise stationary sections AF1, AF2. The rotating part can be an annular drive. One or more motor-driven parts associated with the second receptacle A2 form the further conveying a direction F3.

In particular, at least one heating H is arranged in the area on the upstream and/or downstream side and/or along the transverse extension of the curved contact surface AF or at least of the placement position AP, which is designed to emit heat in response to information signaled by the control unit. In a variant not further illustrated with several heating zones, these are provided and set up to emit heat independently of one another in response to information signaled by the control ECU.

The circular-cylindrical drum of the second receptacle A2 has a curved contact surface AF, which has openings O1 to be connected to a vacuum source Vak. Provided that the second carrier BM is guided around the curved contact surface AF and the vacuum source Vak is connected to the openings O1, the second carrier BM is brought into close contact with the curved contact surface AF by the vacuum pressure. In one variant of the device, the further conveyor F3 comprises two drives that—synchronously rotate the individual sections AF1, AF2 in order to convey the second carrier BM along the placement position AP, controlled by the signaling from the ECU.

In FIG. 1a, for the sake of clarity, only a section of the second carrier BM is shown which is located directly in the placement position AP and to which a component B has already been transferred from the first carrier W by means of the separating device TE, and a component B is being transferred from the first carrier W by means of the separating device TE.

In a variant not illustrated further, a fixed web engages over the heating H parallel to the central longitudinal axis of the circular cylindrical drum. This lifts the second carriers BM from the heating in a controlled manner, while guiding them over the curved anlage surface AF.

The heating is used to heat electronic subassemblies ANT located on the second carrier BM before the placement position AP and/or in the area before the placement position AP and/or after the storage position ANT. For this purpose, the heating H in a variant shown here is designed as a resistance heating strip which at least partially follows the circumference of the second receptacle A2 and is subdivided into separately energizable heating zones. In this way, the temperature of the subassemblies ANT on the second carrier BM can be raised and lowered again in a controlled manner so that the solder joint (and possibly also the adhesive bond) between the respective component B, which is placed on the corresponding subassembly ANT, is both electrically and mechanically stable and reliable.

In another variant of the apparatus, not further illustrated, a heat shield is arranged upstream and/or downstream of the depositing position, as seen in the conveying direction of the second carrier BM. Alternatively or cumulatively, a gap for the second carrier BM is arranged between the curved receptacle A2 and the heat shield. In this way, the heating H does not heat the first support and an adhesive layer located between the components B and the first support W, or heats them only slightly.

FIG. 1 illustrates how a buffer store PS is arranged upstream of the placement position AP/the curved contact surface AF, which is provided and set up to hold a supply of the second beam BM. For this purpose, the second carrier BM is guided through the buffer store in the form of a rectangular, upwardly open box which, in a variant not illustrated, holds or compresses the second carrier BM with negative pressure.

A first image acquisition device 11 is provided and set up to capture an image of at least one component B located on the first carrier W in a vertical (plus-minus) 50° plan view in the area of the placement position AP and to signal the position of at least one component B to the control ECU. In addition, a second and a third image acquisition device 12, 13 are arranged and are provided and set up for carrying out image captures from the second carrier BM without/with the component B transferred to the subassembly ANT in a respective vertical (plus-minus 50°) plan view in the region upstream and downstream of the placement position AP, respectively, and for signaling the position of at least one component B to the control unit ECU.

In addition, a distance D between the curved contact surface AF and the first receptacle A1 can be adjusted by a first adjustment device V1.

At least one hold-down device NH is provided along the second carrier BM in the area on the upstream and/or downstream side of the placement position AP and is set up to expose the second carrier BM in the area of the curved contact surface AF to the vacuum Vak from the openings in the contact surface AF with controlled contact pressure.

The hold-down device NH is a rotatably mounted roller without drive, which has a larger circumference/one or more thickenings in sections, namely in the area of the subassemblies ANT, and along its axis of rotation. This thickening orients the second support BM as early as possible toward the second receptacle A2.

As shown in the left half of FIG. 1, a third receptacle A3 and a dispenser SE for adhesive K are arranged in the area upstream of the placement position AP. The second carrier (BM) passes between the further curved contact surface AF2 and the adhesive dispenser KS1. In response to information signaled by the control unit ECU, the dispenser SE dispenses adhesive K onto the second carrier BM in a portioned manner.

During operation of the device, an electronic component B is transferred from the first carrier W to the second carrier BM. The first carrier W detachably carries a plurality of individual components. The second carrier BM is quasi-endless and carries the plurality of electronic subassemblies ANT in one track along its length. One of the components B is to be transferred from the first carrier W for each electronic subassembly ANT. The procedure is as follows:

The first carrier W with the components B is accommodated in the first receptacle A1. The first carrier W is held in the first receptacle A1 in such a way that the components B it supports are oriented toward the second receptacle A2, and thus toward the electronic subassemblies ANT.

The second carrier BM is guided along its longitudinal extension in a conveying direction of the second carrier BM through the second receptacle A2 to the placement position AP, so that the individual subassemblies ANT of the second carrier BM pass the placement position AP one after the other.

In response to information signaled by a control unit, the second carrier BM is conveyed in its position relative to the placement position AP by a second conveying device F2 in such a way that an electronic subassembly ANT on the second carrier BM is conveyed to the deposit position AP on the second receptacle A2 guiding the second carrier BM at the location where the respective component B will land.

The components B are separated from the first carrier W by a separating device TE in the form of an impact needle controlled by the electronic control unit or a laser beam in a contacting or non-contacting manner in order to transfer them to the second carrier BM.

In the area of the second receptacle A2, the heating H acts to temper the second support BM before, at, and/or after the placement position AP from its side remote from the first receptacle A1.

The placement position AP on the web material of the second carrier BM is detected spatially/temporally before the actual component deposit. The second image acquisition device 12 detects directly, i.e. not through the second carrier, but the respective component placement position on the second carrier BM itself. The second carrier BM is then conveyed to/positioned at the placement position AP in such a controlled manner that the component placement position is aligned as precisely as possible with the position of the component to be deposited on the first carrier W when the separator TE separates this component B from the first carrier W and then transfers it in the Z direction to the second carrier BM.

By tempering the second carrier BM/the electronic subassembly ANT on the second carrier BM by the heating H, the relevant portions/areas of the electronic subassembly ANT are heated to such an extent that solder or parts of the electronic subassembly ANT located thereon are melted, and a component with its contact points is transferred precisely from the first carrier in the placement position AP to the electronic subassembly ANT and is solidly and securely electrically and mechanically connected thereto. By routing the second carrier BM with the electronic subassemblies ANT along the heating system (if necessary, with the temperature to be individually set to rise stepwise or steplessly along the heating system to the placement position AP and then fall to a predefined temperature), which is to be matched to the material of the electronic subassemblies ANT to be tempered and melted, the electrical and/or mechanical contact can be made very precisely.

The first receptacle A1 with the first carrier W is located directly above the second carrier BM at the second receptacle A2. In this case, the first receptacle A1 and the separating device TE have a space of movement transverse to the conveying direction FR of the second carrier BM that at least approximately corresponds to the width of the second carrier BM. (See FIG. 2) As a result, the working/component deposit area extends approximately over the width of the second carrier BM. This also applies in particular to variants designed to process second carriers BM with several subassemblies ANT in the transverse direction.

The first image acquisition device 11 is adapted to capture image data of a region in which the separating means TE is adapted to interact contactingly or non-contactingly with at least one of the components B to separate it from the first carrier W.

The control unit ECU is set up to determine position data of the component B to be transferred from the acquired image data, and to generate control commands for the separating device TE and the respective conveying devices F1, . . . Fn on the basis of the position data.

The second image acquisition device 12 is arranged on the upstream side with respect to the conveying direction X of the second carrier BM relative to the placement position AP at the second receptacle A2 and is provided and set up for detecting, transversely to the conveying direction X of the second carrier BM, in each case one or more of the plurality of electronic subassemblies ANT on the second carrier BM in their position relative to the second receptacle and for signaling information presenting the detected position to the control ECU.

A first sensor device SE1 is assigned to the third conveyor device F3 for the second carrier BM, which is provided and set up to signal to the control unit ECU information on the conveying direction and conveying path of the second carrier BM and, if applicable, of the electronic subassemblies located on the second carrier BM relative to the placement position AP.

The control unit ECU serves to control the second conveyor F2 based on the information of the second image capture device 12 for the position of the at least one electronic subassembly ANT and the information to the conveying direction and conveying path of the second carrier BM and based on the information of the first image acquisition device 11 for the position of at least one of the components B relative to the placement position AP. Thus, the control unit ECU causes the separating device TE to be moved (in the conveying direction and) transversely to the conveying direction X of the second carrier BM to the placement position AP, and the separating device TE to be activated in the sense of separating the component B from the first carrier W, in variants designed to process second carriers BM having a plurality of subassemblies ANT in the transverse direction. When the electronic subassemblies ANT are arranged in a single row, the separating device TE does not perform a transverse movement but only a lowering/lifting movement (in the z-direction) during operation of the device.

A fourth conveyor F4 serves, in response to information signalized by the control ECU, to move the first receptacle A1 along the conveying direction FR of the second carrier BM relative to the second receptacle A2.

Overall, each component B of the first carrier W can thus be positioned within a line two-dotted area AF for transferring a component B to the second carrier BM on the second fixture A2 by appropriately controlling the corresponding X/Y drives of the conveyors F1, F4. In one variant, the dash-dotted two-dotted area AF can be larger in the transverse extension of the second carrier BM than the transverse extension of the second carrier BM.

A fifth conveyor F5 is used to rotate the first receptacle A1 by an angle theta relative to the second receptacle A2 in response to information signed by the control ECU.

In one variant, the separating device TE is designed to separate the—components B from the first carrier W by contacting them. For this purpose, it has an impact needle N that is set up and dimensioned to puncture the first carrier W (from above in FIG. 1) in response to information signaled by the control unit ECU in order to detach one of the components B from the first carrier W and transfer it to the second carrier BM. In a second variant, it is set up to detach the components B from the first carrier W by contact-free. For this purpose, the separating device TE has a controllable energy source which is set up and dimensioned to feed the first carrier W with, for example, laser energy in response to signaling information from the control unit ECU in order to detach one of the components B from the first carrier W and transfer it to the second carrier BM, in each case.

The second receptacle A2 is a circular-cylindrical drum or a convexly curved surface via which the second carrier BM reaches the placement position AP on the second receptacle A2. In one embodiment, the second receptacle A2 has a plurality of small outlets on its shell/surface guiding the second carrier BM in order to hold the second carrier BM on the second receptacle A2 by means of vacuum Vak in a slip-free and stretch-free manner.

In one variant, the jacket/surface of the second holder can be set up or the vacuum Vak can be controlled in such a way that no vacuum Vak is applied to the jacket/surface below the placement position, but only on the upstream side and downstream side of the placement position AP. Thus, the second carrier BM is kept under negative pressure on the upstream and downstream sides of the placement position AP.

In one embodiment, the second receptacle A2 can be moved in the Z-direction toward and away from the first receptacle A1 with an adjustment device to adjust a distance between the first and second receptacles.

In a further variant, compressed air can be introduced into the second receptacle A2 and/or the third receptacle A3, at least at a part of the respective area where the second carrier BM is not in contact with the respective receptacle A2 or A3, which air exits through the openings in order to blow off any contamination that may have been sucked into the vacuum holes over time.

A third image acquisition device 13 is arranged on the downstream side with respect to the conveying direction FR of the second carrier BM relative to the placement position AP at the second receptacle A2. It is used to detect the position of at least one of the plurality of electronic subassemblies ANT on the second carrier BM and the component B transferred to it relative to one another and to signal information—representing the detected position to the control ECU.

An eighth conveyor F8 serves to convey the second image acquisition device 12 relative to the second receptacle A2 and the placement position AP in order to capture at least one component deposit location on the second carrier BM by the second image acquisition device 12. In variants designed to process second carriers BM having a plurality of subassemblies ANT in the transverse direction, the second image acquisition device 12 is movable in the longitudinal extension of the drum shaped second receptacle A2, i.e. transversely to the conveying direction of the second carrier BM, and/or in a controlled manner by a predetermined angular amount along the circumference at the circumferential surface of the drum shaped second receptacle A2. Alternatively, the angle is set manually before starting operation. In variants for second supports BM with single-row subassemblies ANT, the second image acquisition device 12 is to be rigidly mounted and its field of view is adjusted once.

In this way, the position of at least one of the plurality of electronic-subassemblies ANT on the second carrier BM can be detected in order to signal information representing the detected position to the control ECU. Furthermore, in this variation a ninth conveyor F9 is provided to convey the third image acquisition device 13 relative to the second receptacle A2 and the placement position AP in a manner analogous to that performed by the eighth conveyor F8 for the second image acquisition device 12. Thus, the third image acquisition device 13 can capture at least one of the plurality of electronic subassemblies ANT on the second carrier BM and the component B transferred thereto in their position relative to each other and signal information—representing the captured position to the control ECU.

A further (partial) device, as illustrated on the left in FIG. 1, is used to apply adhesive K from a supply to a second carrier BM. As already mentioned, the second carrier BM is of quasi-endless design and carries in its longitudinal and/or transverse extension a plurality of electronic subassemblies ANT to which the adhesive K is to be applied in order to subsequently transfer a component B to one of the subassemblies ANT. The further device comprises a third receptacle A3, which is used to guide the second carrier BM along its longitudinal extension in a conveying direction FR of the second carrier BM.

In FIG. 1, a dispensing device SE for adhesive K is shown above the third receptacle A3 in order to apply adhesive K in a controlled and metered manner to the third receptacle A3 at an adhesive dispensing position KS on the second carrier BM at an adhesive dispensing position KAP where one of the plurality of electronic subassemblies ANT is located.

An eleventh conveying device F11 is used to move the dispensing device SE for adhesive K transverse to the conveying direction FR of the second carrier BM relative to the third receptacle A3. A fourth image acquisition device 14 is assigned to the third receptacle A3 and is arranged upstream of the adhesive dispensing position KAP. The fourth image acquisition device 14 serves to capture the position of at least one of the plurality of electronic subassemblies ANT on the second carrier BM relative to the third receptacle A3 and to signal information representing the captured position to the control unit ECU.

In this embodiment, a twelfth conveying device F12 is formed by two-transport rollers to be driven in a controlled manner, which are arranged on the upstream and downstream sides of the drum-shaped third receptacle A3, respectively, and around which the second carrier BM is guided. In response to information signaled by the control ECU, the second carrier BM is conveyed by the two transport rollers, which are to be driven in a controlled manner, in its position relative to the adhesive dispensing position KAP in such a way that at least one of the plurality of electronic subassemblies ANT with the bonding point KS on the second carrier BM reaches the adhesive dispensing position KAP on the third receptacle A3 guiding the second carrier BM.

Alternatively, the twelfth conveyor F12 corresponds to the second conveyor of the second receptacle A2.

In the embodiment shown here, the adhesive applicator cooperates with the transfer device for components from a first carrier to a second carrier. For this purpose, the adhesive dispensing device is inserted on the upstream side of the transfer device for components.

In the apparatus, the gluing point on the web material is detected spatially/temporally before the actual application of the adhesive. In this case, a fourth image acquisition device 14 detects directly, i.e. not through the second carrier BM, but the respective adhesive position KS at the respective electronic subassembly on the second carrier BM itself. The second carrier BM is then moved to the adhesive application position KAP in a controlled manner so that the adhesive location KS is aligned as precisely as possible with the position of the outlet of the dispensing device SE for adhesive K when the dispensing device applies a portion of adhesive K to the adhesive location KS.

The fourth image acquisition device 14 is arranged—with respect to the conveying direction FR of the second carrier BM—on the upstream side of the adhesive application position KAP on the periphery of the third receptacle A3 for the drum and is used for this purpose, in the conveying direction and/or transversely to the conveying direction FR of the second carrier BM, to detect the position of one or more of the plurality of electronic subassemblies ANT on the second carrier BM relative to the third receptacle A3 and to signal information representing the detected position to the control ECU.

A second sensor device SE2 is associated with the twelfth conveyor device F12 in order to signal to the control unit ECU information on the conveying direction and conveying path of the second carrier BM relative to the adhesive application position KAP.

The control unit ECU is used to control the eleventh conveyor F11 to move the dispensing device SE transversely to the conveying direction FR of the second carrier BM based on the information from the fourth image capture a device 14 on the position of the at least one electronic subassembly ANT and the information ma on the conveying direction and conveying path of the second carrier BM, and based on the information from the fourth image acquisition device 14 on the position of at least one of the components B relative to the adhesive dispensing position KAP.

A thirteenth conveyor F13, in response to information signaled by the control ECU, is used to convey the second carrier BM along the conveying direction FR over the third receptacle A3. This is done, controlled by the control ECU, so that the at least one of the plurality of electronic part assemblies ANT on the second carrier BM reaches the adhesive application position KAP on the third receptacle A3 guiding the second carrier BM.

The third receptacle A3 is—comparable to the second receptacle A2—a circular-cylindrical drum or a convexly curved surface via which the second carrier BM reaches the adhesive dispensing position KAP on the third receptacle A3. Here, too, the third receptacle has outlets on its jacket/surface guiding the second carrier BM in order to keep the second carrier BM slip-free and stretch-free on the third receptacle A3 by means of vacuum Vak.

A fifth image acquisition device 15 is arranged on the downstream side of the adhesive application position KAP on the circumference of the drum-shaped third receptacle A3 with respect to the conveying direction FR of the second carrier BM and is used to detect at least one of the plurality of electronic subassemblies ANT on the second carrier BM and the adhesive K applied to them in their position relative to one another and to signal information representing the detected position to the control ECU.

A fourteenth conveying device F14 is used to convey the fourth image acquisition device 14 relative to the third receptacle A3 and the adhesive dispensing position KAP. Thus, the fourth image acquisition device 14 can capture at least one adhesive location KS on the second carrier BM to detect the location of at least one of the plurality of electronic subassemblies ANT on the second carrier BM and signal an information representing the captured location to the control ECU.

A fifteenth conveying device F15 is used to convey the fifth image acquisition device 15 relative to the third receptacle A3 and the adhesive dispensing position KAP along the circumference of the third receptacle A3 and/or transversely to the conveying direction FR of the second carrier BM. Thus, the fifth image acquisition device 15 can capture at least one of the plurality of electronic subassemblies ANT on the second carrier BM and the adhesive K applied thereto in their position relative to each other and signal information representing the captured position to the control ECU.

Figure 2:
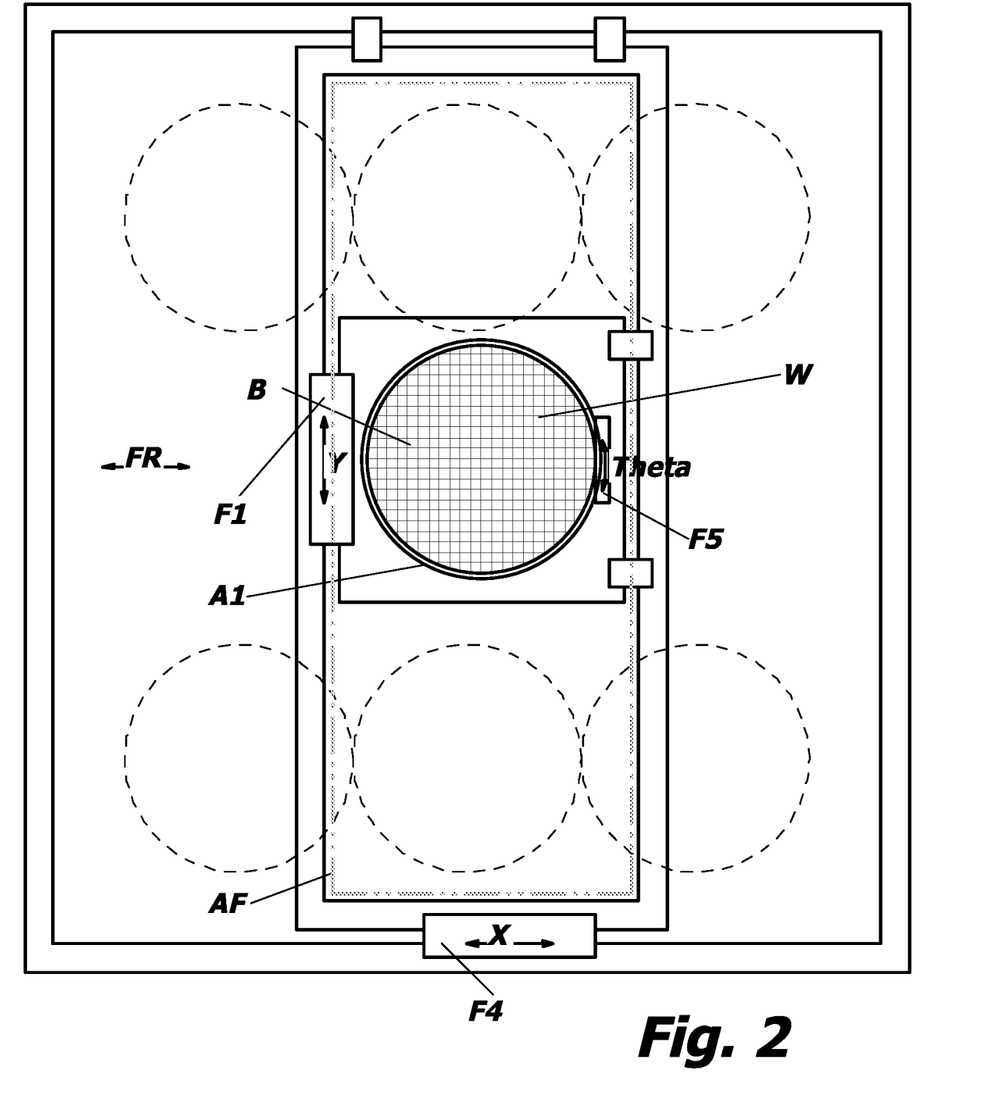
FIG. 2 shows a schematic top view of a table that can be adjusted in X/Y/theta coordinates.

In a particularly simple and advantageous manner, the table adjustable in X/Y/Theta coordinates according to FIG. 2 is designed as follows: The receptacle A1 receiving the first carrier W is arranged on a first carrier plate, wherein the fifth conveyor F5 serves to rotate the first receptacle A1 by an angle theta relative to the first carrier plate.

The first carrier plate is arranged on a second carrier plate so as to be displaceable in the transverse direction (Y) of the second carrier BM. The first conveying device F1 is designed to move the first carrier plate and thus also the first receptacle A1 (exclusively) transversely to the conveying direction FR of the second carrier BM relative to the second carrier plate.

The second carrier plate is arranged on a rigid third carrier plate or on a support frame so as to be displaceable in the conveying direction FR of the second carrier BM. The fourth conveyor F4 is designed to move the first holder W, the first carrier plate and the two carrier plates (exclusively) in the conveying direction FR of the second carrier BM relative to the third carrier plate.

Figure 3:
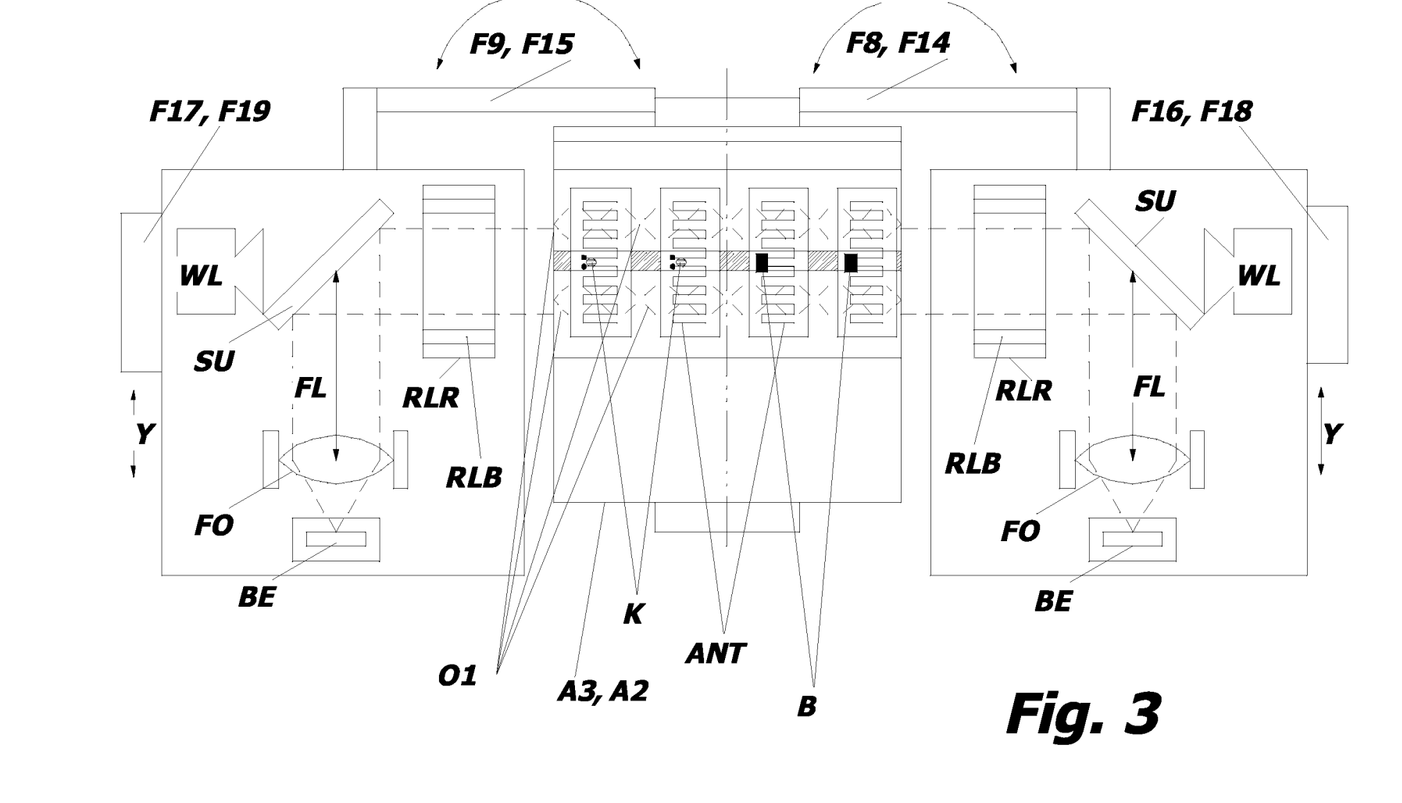
FIG. 3 shows a schematic top view of the second to fifth image capture devices.

In FIG. 3, the second to fifth image acquisition devices 12 . . . 15 for the devices described above for transferring electronic components B from a first carrier W to a second carrier BM and for applying adhesive K from a supply to a second carrier BM are configured as described below.

In one embodiment, either the image acquisition device BE (camera) can be shifted in the Y direction for the image capture devices 12 . . . IS. In this variant, the beam deflection can be omitted. Alternatively, the remaining optics comprising focusing optics, beam deflection and/or illumination can be moved in the Y-direction, while the camera remains stationary and is not moved in the Y-direction. In this variant, the camera is only adjusted in angle via the swivel arm.

An illumination device is associated with an image acquisition device BE in the form of a camera. The illumination device has a white light source WL, a red light source RLR, and a blue light source RLB. The illumination device is used to direct light of different waves length to the second receptacle A2. This allows different details of the components/sub-assemblies, of the adhesive to be image captured by the image acquisition device BE, which is directed at the second carrier BM.

A sixteenth, seventeenth, eighteenth and/or nineteenth conveying device F16 . . . F19 is in each case set up to convey the respective image acquisition device BE with its associated illumination device WL, RLB, RLB along the second or third receptacle A2 A3, i.e. transversely to the conveying direction of the second carrier BM. In other words, sixteenth, seventeenth, eighteenth and/or nineteenth conveying devices F16 . . . F19 drives, and eighth, ninth, fourteenth and/or fifteenth conveying devices F8, F9, F14, F15 are provided motorized swivel arms whose function can also be performed manually.

The eighth, ninth, fourteenth and fifteenth conveyors F8, F9, F14, F15 serve to convey the respective second, third, fourth and/or fifth image acquisition device 12 . . . 15 relative to the respective second and/or third receptacle A2, A3 and the component placement position AP or the adhesive application position KAP along the conveying direction FR of the second carrier BM. In this way, the respective second, third, fourth and/or fifth image acquisition device 12 . . . 15 can be advantageously adapted to different distances of electronic parts construction groups on the second carrier.

In the variant of the illumination device WL, RLB shown, the red-light RLR and the blue-light source RLB are designed as a ring light source which surrounds a capture area EB of the image acquisition device BE. The white-light source WL is arranged on a side of a partially light-transmitting beam deflector SU in the form of a 45° mirror, which is remote from the acquisition area EB of the image acquisition device BE. The image acquisition device BE has in each case a focusing optics FO which is arranged at a fixed adjustable distance FL from the side facing it of an at least partially light-transmissive beam deflection SU.

The invention claimed is:

1. An apparatus for transferring electronic components from a first carrier to a second carrier, wherein
the first carrier carries a plurality of individual components detachably therefrom, and
the second carrier carries, in a longitudinal extension, a plurality of electronic subassemblies, and wherein the apparatus comprises:
a first receptacle configured to receive said first carrier;
a second receptacle configured to guide said second carrier along the longitudinal extension in a conveying direction of said second carrier, wherein the first receptacle is configured to receive the first carrier such that the components are oriented towards the second receptacle and the second receptacle has a contact surface that is curved in the conveying direction of the second carrier;
a separating device configured to separate the components from the first carrier in a contacting or non-contacting manner so as to transfer the components to the second carrier;
a conveying device for the second carrier provided with the second receptacle, wherein the conveying device is configured to convey the second carrier in a position relative to a placement position in response to information signalled by a control unit, that an electronic subassembly on the second carrier reaches the placement position on the second receptacle; and
a heating device configured for tempering the second carrier before, at or after the placement position from a side remote from the first receptacle by control of the heating device by the control unit as a function of material properties, a melting point of contact points of the component to be transferred and/or the material properties, the melting point of contact points of the electronic subassembly on the second carrier, wherein the heating device is a heating strip with one or more heating zones to be heated to different temperatures, said heating strip a shape at least partially following a contour of the second receptacle and which is configured to heat the second carrier.

2. The apparatus for transferring electronic components from a first carrier to a second carrier according to claim 1, wherein the second receptacle comprises the conveying device for the second carrier at least partially, and the conveying device occupies only a part of the second receptacle transverse to the conveying direction of the second carrier, and/or the curved contact surface and/or the conveying device have openings to be connected to an underpressure source that are configured to bring the second carrier into abutment with the curved contact surface.

3. The apparatus for transferring electronic components from a first carrier to a second carrier according to claim 1, wherein the curved contact surface is rigid, and
the conveying device divides the curved contact surface along the conveying direction of the second carrier into at least two sections.

4. The apparatus for transferring electronic components from a first carrier to a second carrier according to claim 1, wherein the heating device is configured to provide an electrical and mechanical connection between the component and the second carrier by signaling from the control unit when the component is deposited on the second carrier by bringing the electronic subassemblies on the second carrier to a temperature, at which material of the electronic subassembly or solder are brought to their melting temperature at least at exposed ends of the electronic subassembly, and contacts of the component are brought into contact therewith when the component is deposited.

5. The apparatus for transferring electronic components from a first carrier to a second carrier according to claim 1, further comprising a heat shield arranged upstream and/or downstream of the placement position, and a gap for the second carrier is arranged between the curved contact surface and the heat shield.

6. The apparatus for transferring electronic components from a first carrier to a second carrier according to claim 1, further comprising a buffer store provided on the upstream and/or downstream side of the placement position or the curved contact surface, said buffer store being configured to receive a supply of the second carrier.

7. The apparatus for transferring electronic components from a first carrier to a second carrier according to claim 1, further comprising a first image acquisition device configured to carry out an image acquisition of at least one component located on the first carrier at the placement position and to signal the image aquisition to the control unit, and a second and/or a third image acquisition device configured to carry out image acquisitions of at least one electronic subassembly on the second carrier with or without the component at an upstream and/or downstream side of the placement position and to signal this the image aquisition to the control unit.

8. The apparatus for transferring electronic components from a first carrier to a second carrier according to claim 1, wherein a distance between the curved contact surface and the first receptacle is adjustable by an adjusting device.

9. The apparatus for transferring electronic components from a first carrier to a second carrier according to claim 1, wherein the curved contact surface with the conveying device for the second carrier is movably guided perpendicular to the conveying direction of the second carrier, wherein the curved contact surface and/or the conveying device are positioned by an actuating device in response to information signaled by the control unit.

10. The apparatus for transferring electronic components from a first carrier to a second carrier according to claim 1, further comprising at least one hold-down device provided at an upstream and/or downstream side of the curved contact surface or at the placement position that subjects the second carrier to negative pressure on the curved contact surface.

11. The apparatus for transferring electronic components from a first carrier to a second carrier according to claim 1, wherein at an upstream and/or downstream side and/or along the transverse extension of the curved contact surface or the placement position at least one heating zone is configured to emit heat in response to information signalled by the control unit.

12. The apparatus for transferring electronic components from a first carrier to a second carrier according to claim 1, further comprising a third receptacle and an adhesive dispenser provided upstream of the placement position, wherein the third receptacle and the adhesive dispenser are configured to pass the second carrier between the third receptacle and the adhesive dispenser and wherein the adhesive dispenser is configured for dispensing adhesive in portions onto the second carrier in response to information signalled by the control unit.

13. The apparatus for transferring electronic components from a first carrier to a second carrier according to claim 12, further comprising a fourth and/or a fifth image acquisition device provided upstream and/or downstream of the third receptacle, wherein the fourth and/or fifth image acquisition device is configured to carry out image captures of at least one electronic subassembly on the second carrier with or without the dispensed adhesive at the upstream and/or downstream side of the third receptacle and to signal the image capture it to the control unit.

14. The apparatus for transferring electronic components from a first carrier to a second carrier according to claim 12, wherein the third receptacle includes an additional conveying device that is configured to convey the second carrier along the curved contact surface.

15. The apparatus for transferring electronic components from a first carrier to a second carrier according to claim 1, wherein the separating device is provided with an adjusting device which is configured for positioning the separating device in the conveying direction of the second carrier and/or transversely thereto, said apparatus further comprising a first image acquisition device provided at the placement position and being configured to capture at least one of the electronic subassemblies at a position relative to a placement position on the second receptacle; and a second image acquisition device configured to capture the position of at least one of the electronic subassemblies on the second carrier relative to the second receptacle on the upstream side of the placement position and to signal information representing the captured position to a control unit.

16. A method for transferring electronic components from a first carrier to a second carrier, wherein the first carrier detachably carries a plurality of individual components therefrom, and the second carrier carries in a longitudinal extension a plurality of electronic subassemblies to each of which one of the components is to be transferred from the first carrier in a placement position, and wherein the method comprises:

receiving the first carrier with a first receptacle;

guiding the second carrier along the longitudinal extension in a conveying direction of the second carrier with a second receptacle;

receiving the first carrier with the first receptacle so that the components carried by the first carrier are oriented towards the second receptacle;

separating the components from the first carrier with a separating device in a contacting or contactless manner so as to transfer the components to the second carrier;

conveying the second carrier in response to information signalled by a control unit in a position relative to the placement position by a conveying device for the second carrier so that an electronic subassembly on the second carrier reaches the placement position on the second receptacle, wherein a heating device tempering the second carrier before, at or after the placement position from a side remote from the first receptacle by controlling the heating device by the control unit uniformly or in sections as a function of material properties, a melting point of contact points of the component to be transferred and/or the material properties, the melting point of contact points of the electronic subassembly on the second carrier, wherein the heating device is a heating strip with one or more heating zones to be heated to different temperatures, wherein the heating strip has a shape at least partially following the contour of the second receptacle and heats the second carrier.

* * * * *